United States Patent [19]
Haertling et al.

[11] Patent Number: 5,312,674
[45] Date of Patent: May 17, 1994

[54] LOW-TEMPERATURE-COFIRED-CERAMIC (LTCC) TAPE STRUCTURES INCLUDING COFIRED FERROMAGNETIC ELEMENTS, DROP-IN COMPONENTS AND MULTI-LAYER TRANSFORMER

[75] Inventors: Carol Haertling, Santa Ana; Andrew A. Shapiro, Orange; Charles A. Goodman, Garden Grove; Ramona G. Pond, Downey; Robert D. Washburn, Malibu; Robert F. McClanahan, Valencia; Carlos H. Gonzalez, La Mirada; David M. Lusher, Gardena, all of Calif.

[73] Assignee: Hughes Aircraft Company, Los Angeles, Calif.

[21] Appl. No.: 923,409

[22] Filed: Jul. 31, 1992

[51] Int. Cl.⁵ .............................. B32B 9/00
[52] U.S. Cl. ..................... 428/210; 428/209; 501/17; 501/32; 252/62
[58] Field of Search ............ 501/17, 32; 252/62; 428/209, 210

[56] References Cited

U.S. PATENT DOCUMENTS

| | | | |
|---|---|---|---|
| 4,360,441 | 11/1982 | Borrelli et al. | 501/32 |
| 4,396,682 | 8/1983 | Mohri et al. | 501/17 |
| 4,857,486 | 8/1989 | Ebata et al. | 501/32 |
| 4,991,283 | 2/1991 | Johnson et al. | 264/61 |
| 5,028,473 | 7/1991 | Vitriol et al. | 428/209 |

OTHER PUBLICATIONS

"Development of a Low Temperature Cofired Multi-layer Ceramic Technology", by William Vitriol et al., ISHM Proceedings 1983, pp. 593–598.

Primary Examiner—Patrick J. Ryan
Assistant Examiner—Cathy Lee
Attorney, Agent, or Firm—Elizabeth E. Leitereg; Terje Gudmestad; W. K. Denson-Low

[57] ABSTRACT

A ferromagnetic material (18,20) in ink or tape form is sinterable using a same firing profile as and has approximately the same thermal shrinkage characteristics as low-temperature-cofired-ceramic (LTCC) tape, and is chemically non-reactive therewith. The ferromagnetic material (18,20) is applied to the surfaces of LTCC tape sheets (12,14,16) to form desired elements such as cores for inductors (22) and transformers and magnetic shields. Ferromagnetic vertical interconnects (vias) (54) can be formed by punching holes (56) through tape sheets (46) and filling them with ferromagnetic ink. The tape sheets (12,14,16) and ferromagnetic elements (18,20) are laminated together and cofired to form an integral structure (10). Ferromagnetic and non-magnetic components (114) can be fabricated separately and inserted into cavities (104a, 106a,108a) in tape sheets (104,106,108) prior to cofiring. A multi-layer transformer (250) includes primary (254b, 256b,258b,254d,256d,258d) and secondary (254c,256c,258c) coils, each being formed of vertically aligned, arcuate conductors which are printed on separate tape sheets (254,256,258) and vertically interconnected at their ends to form continuous electrical paths therethrough.

16 Claims, 5 Drawing Sheets

LOW-TEMPERATURE-COFIRED-CERAMIC (LTCC) TAPE STRUCTURES INCLUDING COFIRED FERROMAGNETIC ELEMENTS, DROP-IN COMPONENTS AND MULTI-LAYER TRANSFORMER

BACKGROUND OF THE INVENTION

1. Field of the Invention

The present invention generally relates to the art of hybrid electronic circuit structures fabricated from low-temperature-cofired-ceramic (LTCC) tape, and more specifically to cofired LTCC tape structures and fabrication methods incorporating ferromagnetic elements, drop-in components and transformers.

2. Description of the Related Art

Fabrication of multilayer electronic structures for hybrid microcircuit technology and other applications includes the "thick film process" in which individual conductor and dielectric compositions in paste form are sequentially deposited on insulating substrates and then fired, one layer of material at a time, to fabricate a thick film, multilayer circuit.

A disadvantage of the thick film process is that voids or pinholes can be formed in the thick film dielectric material during the sequential printing and firing process. Another disadvantage is that the requirement for building up many multiple thick film layers in the more complex hybrid circuits results in an expensive process due to the number of individual processing steps involved. A third disadvantage is that a mistake on an individual layer requires scrapping the entire unit.

A second approach to the fabrication of hybrid microcircuits is the cofired ceramic process. This technology utilizes dielectric material formed into sheets having alumina as a main component. Individual sheets of tape are printed with metallization and other circuit patterns, stacked on each other, laminated together at a predetermined temperature and pressure, and then fired at a desired elevated temperature at which the material fuses or sinters.

Where alumina is generally used as the insulating material, tungsten, molybdenum or molymanganese is typically used for metallization, and the part is fired to about 1,600° C. in an $H_2$ reducing atmosphere.

The undesirable high processing temperature and requisite $H_2$ atmosphere, and more importantly the electrical performance of the refractory metals has led to the development of Low-Temperature-Cofired-Ceramic (LTCC) tape. A preferred LTCC is commercially available from the DuPont Company as Green Tape ® no. 851AT. The tape contains a material formulation including a mixture of glass and ceramic fillers which sinter at about 850° C., and exhibits thermal expansion similar to alumina.

The low-temperature processing permits the use of air fired resistors and precious metal thick film conductors such as gold, silver, or their alloys. In the typical high-temperature process, screen-printed resistors cannot be used and only refractory metal pastes are used as conductors.

A discussion of thick film technology, and high and low temperature cofired ceramic tape technology, is found in "DEVELOPMENT OF A LOW TEMPERATURE COFIRED MULTILAYER CERAMIC TECHNOLOGY", by William Vitriol et al, ISHM Proceedings 1983, pp. 593-598.

Ferromagnetic inks have been developed for use with the thick film process described above. These inks can be screen printed together with other paste layers onto a substrate to form cores or enhancers for inductors, magnetic shield planes, and other ferromagnetic elements. However, these inks are not usable with the LTCC process because they have a dissimilar shrinkage profile to LTCC tape. This causes warping or buckling of the LTCC tape structure during firing.

For this reason, magnetic components, including transformers, as well as non-magnetic components such as heat sinks and varistors have previously been fabricated separately and fixed to the surfaces of LTCC structures. This is disadvantageous in that the space on the surfaces of the structures is severely limited, and should be utilized for the mounting of hybrid microelectronic integrated circuit chips and interconnects.

SUMMARY OF THE INVENTION

In accordance with a method of the present invention, a ferromagnetic material is provided in ink or tape form which is sinterable using a same firing profile as and has approximately the same thermal shrinkage characteristics as low-temperature-cofired-ceramic (LTCC) tape, and is chemically non-reactive therewith.

The ferromagnetic material is applied to the surfaces of LTCC tape sheets to form desired elements such as cores for inductors and transformers and magnetic shields. Ferromagnetic vertical interconnects (vias) can be formed by punching holes through tape sheets and filling them with the ferromagnetic ink. The tape sheets and ferromagnetic elements are laminated together and cofired to form an integral structure.

The ferromagnetic ink and tape enable magnetic elements to be buried in the LTCC tape structure, rather than being mounted on the surface. This conserves valuable surface space which can be more advantageously used for the mounting of hybrid microelectronic integrated circuit chips and interconnects.

In another embodiment of the invention, ferromagnetic and non-magnetic components are fabricated separately and inserted into cavities in the tape sheets prior to cofiring. Burying separately formed components in the LTCC tape structure further conserves surface space.

A multi-layer transformer embodying the invention includes primary and secondary coils, each being formed of vertically aligned, arcuate conductors which are printed on separate tape sheets and interconnected at their ends by vias to form continuous electrical paths therethrough.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
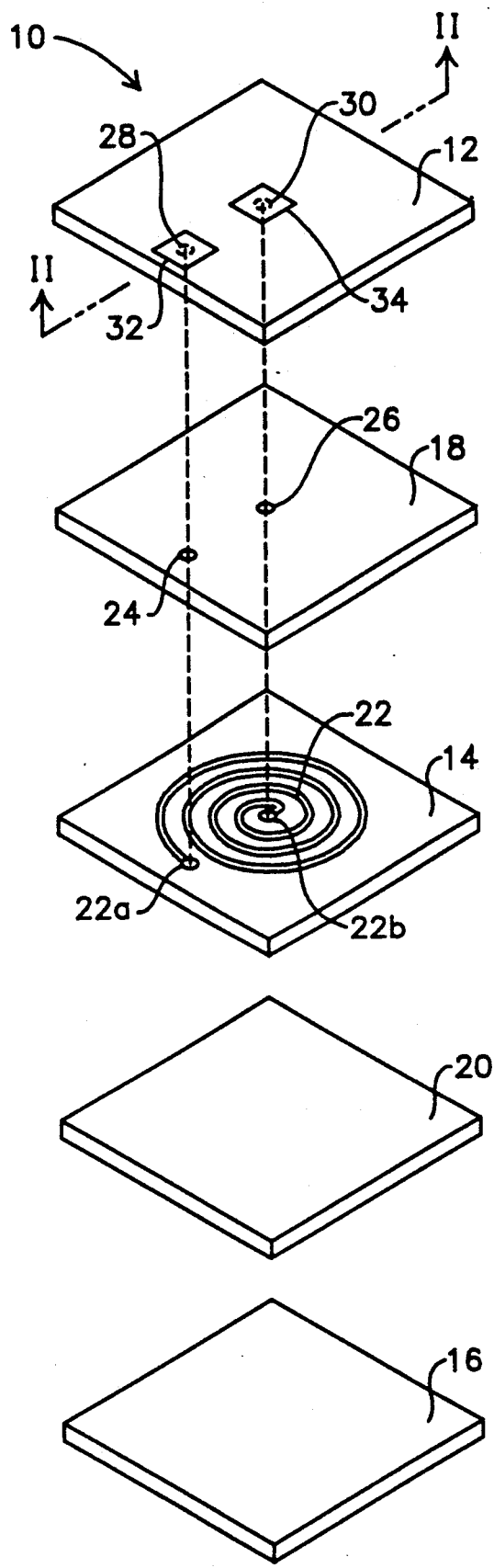
FIG. 1 is an exploded view illustrating an LTCC tape structure including ferromagnetic tape inductance enhancing sheets prior to lamination in accordance with the present invention.

FIGS. 1 to 7 illustrate low-temperature-cofired ceramic (LTCC) structures which include ferromagnetic elements formed from ferromagnetic ink or tape. The ink is used in the same manner as other LTCC inks or pastes, and is screen printed onto the surface of LTCC sheets in the desired patterns to form flat layers or filled into holes to form vertical interconnects (vias). The tape is cut to the desired shape and placed on the surface of a sheet of LTCC tape.

The tape sheets and ferromagnetic elements are then sandwiched together, laminated, prefired to bake out the organic vehicle materials and cofired at a temperature at which the LTCC tape and ferromagnetic material sinter (typically 850° C.) to form an integral cofired ceramic tape structure. The conventional LTCC processing technology is applicable without modification to fabricate structures in accordance with the present invention.

The ferromagnetic material is formulated to be chemically non-reactive with the LTCC tape, and have mechanical and thermal properties which are as close to those of LTCC tape as possible. In order to be cofirable, the ferromagnetic material must be sinterable using the LTCC firing profile. The ferromagnetic material must also have approximately the same thermal shrinkage characteristics, including shrinkage (10–15%) and shrinkage rate, as the LTCC tape in order to prevent warpage during firing.

The ferromagnetic material embodying the present invention may be provided in fluid (ink or paste) or flexible tape form. The ink formulation may be different for inks designed for printing on the surface of LTCC tape and for filing vias. In either form, the ferromagnetic material includes three main components; a ferromagnetic oxide powder, a glass powder or "frit" and an organic binder or vehicle.

The ferromagnetic oxide may be selected from either of the three main groups of ferrites; spinel, garnet and magnetoplumbite, depending on the desired properties. Spinels have the general formula $MO.Fe_2O_3$, $MFe_2O_4$ or $MFe_3O_4$, where M is typically nickel (Ni), zinc (Zn), manganese (Mn), magnesium (Mg), lithium (Li), copper (Cu), cobalt (Co) or another element. Garnets have the general formula $3M_2O_3.5Fe_2O_3$ or $M_3Fe_5O_{12}$, where M is most commonly yttrium (Y) or one of the rare earth ions. Magnetoplumbites have the general formula $MFe_{12}O_{19}$ or $MO.6Fe_2O_3$, where M is typically barium (Ba), gallium (Ga), chromium (Cr) or manganese (Mn). These ferromagnetic oxides can also be combined in many ways depending on a particular application.

The glass frit generally includes silicon dioxide ($SiO_2$), and one or a mixture of materials including lead oxide (PbO), bismuth oxide ($Bi_2O_3$), sodium oxide ($Na_2O$) lithium oxide ($Li_2O$) and potassium oxide ($K_2O$)

Examples of preferred embodiments of ferromagnetic materials which have been determined to be cofirable with LTCC tape and have ferromagnetic properties suitable for magnetic inductor and transformer cores, magnetic shields and other applications will be described below. It will be understood, however, that these particular examples do not limit the scope of the invention.

The preferred ferromagnetic oxide is a nickel-zinc ferrite powder which is commercially available from Krystinel Corp. of Paterson, N.J. as product no. K31. The main constituent of Krystinel K31 is $NiZnFe_3O_4$.

The volume percentages of the constituents of the print ink (for forming planar surface patterns) are 64% ferrite-glass powder and 36% organic vehicle. The ferrite-glass powder includes, by volume, 80% Krystinel K31 and 20% glass frit.

The glass frit in the print ink is a lead-silicon-borate glass powder which is available from Transene Co, Inc. of Rowley, Mass. as Transene Glass Composition no. T90. The weight percentages of the constituents of Transene T90 are 44% lead oxide (PbO), 4% aluminum oxide ($Al_2O_3$), 10% boron oxide ($B_2O_2$) and 40% silicon dioxide ($SiO_2$).

The composition, particle size and particle size distribution of the ferromagnetic oxide and glass frit mainly determine the thermal and shrinkage properties of the material. The lead oxide in the Transene T90 frit lowers the melting point of the glass frit to approximately 590° C., aiding in densification of the ferromagnetic ink or tape.

The weight percentages of the constituents of the organic vehicle in the print ink are 45% texanol solvent (2,2,4 trimethyl pentanediol-1,3 monoisobutyrate), 45% butyl carbitol acetate solvent (2-2(butoxyethoxy) ethyl acetate, 10% ethyl cellulose polymer vehicle which is available from Hercules, Inc. of Tustin, Calif. as Ethyl Cellulose no. N50 and 0.5% thixatrol rheology adjuster which is available from Rheox, Inc. of Hightstown, N.J. as Thixatrol ST Rheological Additive no. 32051.

The via ink has the same general composition as the print ink, except that it is preferably includes a lower percentage of solvent so that it will have lower viscosity Also, the particle size of the constituents is preferably larger than for the print ink.

The volume percentage of the constituents of the ferromagnetic tape are 6.69% ferrite-glass powder and 91.31% organic vehicle. The ferrite-glass powder includes, by volume, 78% Krystinel K31, 20% glass frit and 2% bismuth oxide ($Bi_2O_3$). The glass frit is the same as for the print ink.

The organic vehicle for the tape includes, by volume, 9.01% DuPont Evacite Acrylic Resin no. 2042, 3.75% DuPont Evacite Acrylic Resin no. 2043, 6.1% butyl benzyl pthalate plasticizer which is available from ChemCentral of Santa Fe Springs, Calif. as Santicizer 160 and 75.88% trichloroethane.

The present ferromagnetic tape can be manufactured using the same technology as for LTCC tape.

FIG. 1 illustrates an LTCC tape structure 10 prior to lamination which includes sheets of the present ferromagnetic tape for increasing or enhancing the inductance of an inductive coil. The structure 10 includes LTCC tape sheets 12, 14 and 16, and ferromagnetic tape sheets 18 and 20 which are sandwiched on opposite sides of the sheet 14.

An inductor 22 is formed as a spiral coil of electrically conductive ink on the upper surface of the sheet 14. Ends 22a and 22b of the inductor 22 are connected through vias 24 and 26 which extend through the sheet 18 and vias 28 and 30 which extend through the sheet 12 to conductor pads 32 and 34 respectively which are formed on the surface of the sheet 12. Since the ferromagnetic sheets 18 and 20 have very high electrical resistivity and can be considered as insulators, the vias 24 and 26 are not shorted out by the sheet 18.

Figure 2:
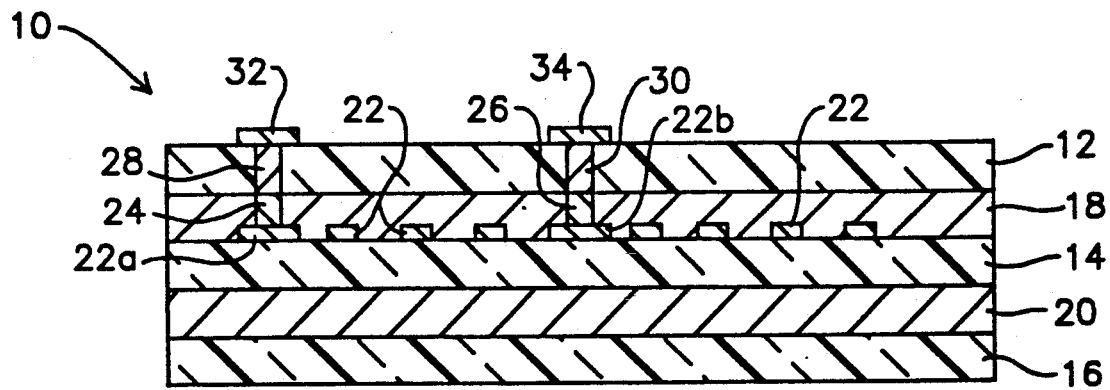
FIG. 2 is a section taken on a line II—II of FIG. 1 after cofiring of the structure.

The structure 10 is fabricated by sandwiching the elements illustrated in FIG. 1 together, laminating, prefiring and cofiring to produce the integral structure 10 as illustrated in FIG. 2.

The sheets 18 and 20 are vertically aligned with the inductor 22, and interact with the magnetic field produced upon flow of current through the inductor 22 to increase or enhance the inductance of the inductor 22. If desired, only one of the sheets 18 and 20 may be provided with a corresponding reduction in inductance enhancement.

Figure 3:
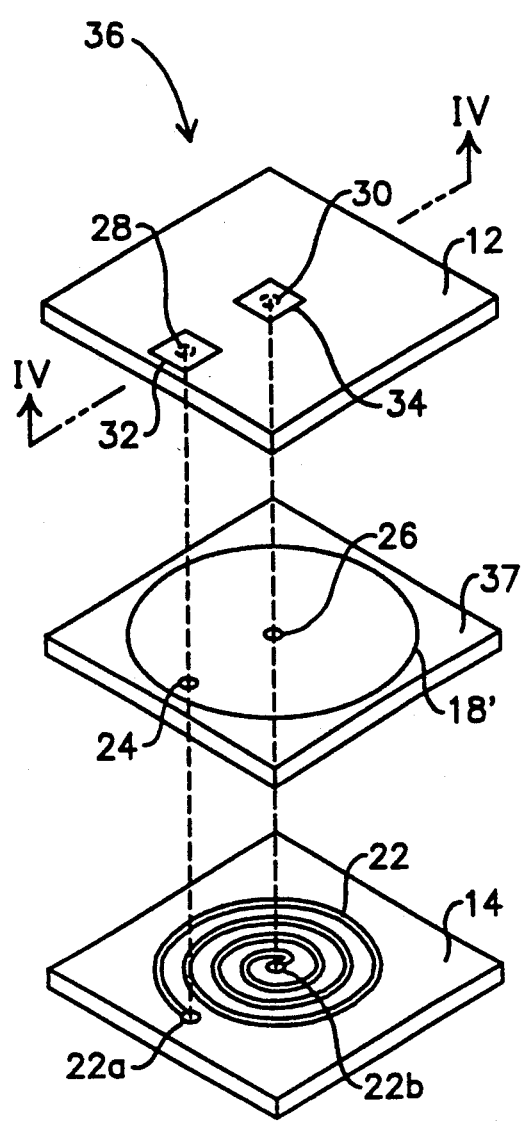
FIG. 3 is an exploded view illustrating an LTCC tape structure including ferromagnetic ink inductance enhancing layers prior to lamination.
Figure 4:
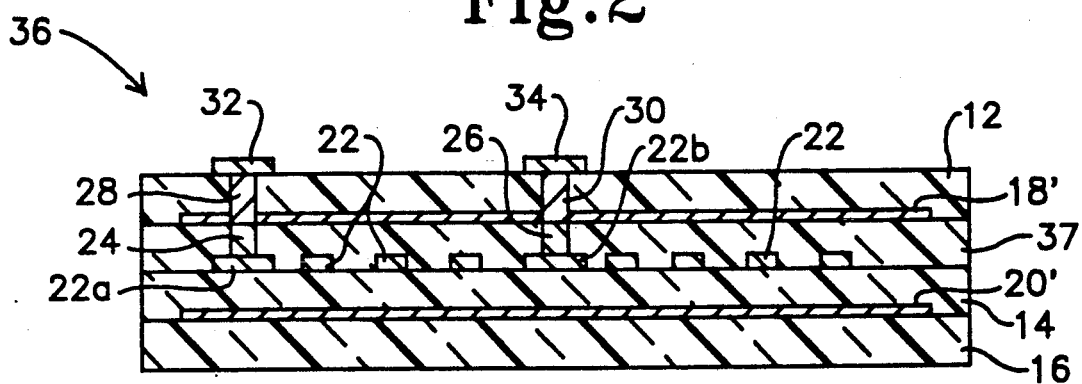
FIG. 4 is a section taken on a line IV—IV of FIG. 3 after cofiring of the structure.

FIGS. 3 and 4 illustrate a structure 36 which is similar to the structure 10 except that the ferromagnetic tape sheet 20 is replaced by a layer 20' of ferromagnetic material formed on the upper surface of the sheet 16. In addition, the ferromagnetic tape sheet 18 is replaced by a layer 18' of ferromagnetic material formed on the upper surface of an LTCC sheet 37.

The layers 18' and 20' are formed by screen printing or otherwise applying ferromagnetic ink embodying the present invention on the surfaces of the sheets 37 and 16 respectively, and allowing the ink to dry to form a solid layer. It will be noted that since the ferromagnetic ink is essentially electrically insulative, the LTCC sheet 37 could be omitted and the ferromagnetic layer 18' printed over the inductor 22 on the sheet 14.

Figure 6:
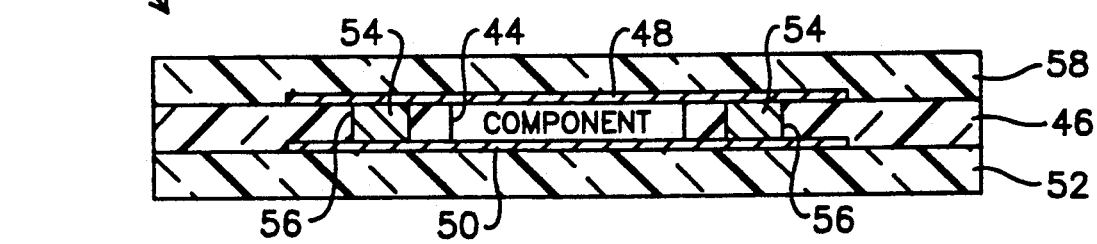
FIG. 6 is a section taken on a line VI—VI of FIG. 5 after cofiring of the structure.
Figures 5, 8:
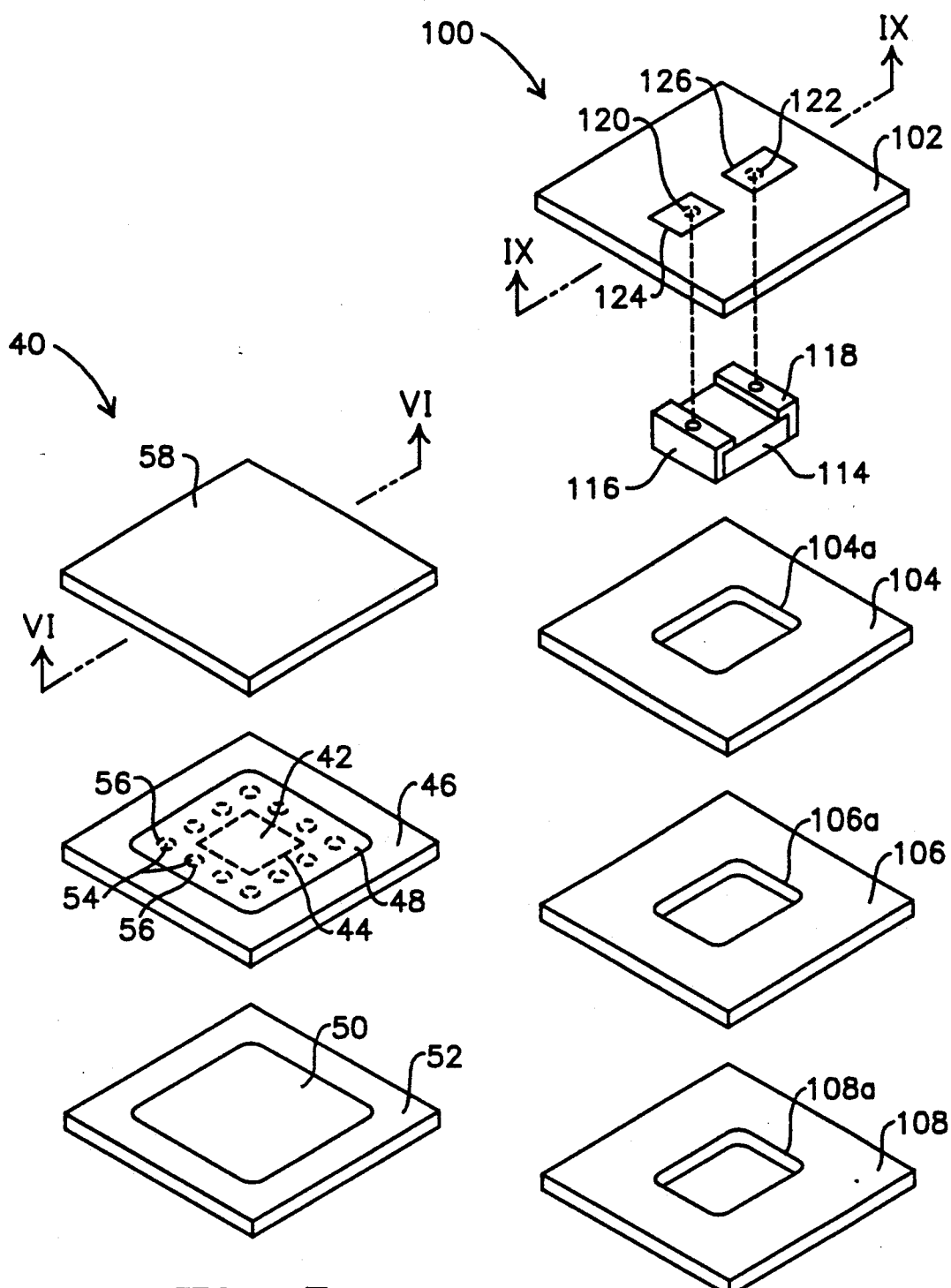
FIG. 5 is an exploded view illustrating an LTCC tape structure including magnetic shield layers and vias formed of ferromagnetic ink prior to lamination.
FIG. 8 is an exploded view illustrating an LTCC tape structure including a buried drop-in component prior to lamination.

FIGS. 5 and 6 illustrate how an LTCC structure 40 embodying the invention can be fabricated as including a magnetic shield for a component 42. The external interconnections of the component 42 are not shown. The component 42 can be an electrical metallization pattern or any other element which must be shielded from external magnetic fields.

The component 42 is inserted in a cavity 44 formed through an LTCC sheet 46. A ferromagnetic layer 48 is formed of ferromagnetic ink or tape over the component 42 and surrounding portions of the sheet 46. Another ferromagnetic layer 50 is formed of ferromagnetic tape or ink on the surface of an LTCC sheet 52 in vertical alignment with the layer 48. In addition, a plurality of ferromagnetic vias 54 are formed in respective holes 56 which extend through the sheet 46. The vias 54 are formed by screen printing ferromagnetic ink into the holes 56 to fill or at least coat the walls of the holes 56.

The vias 54 form a magnetic ring or fence around the component 42. The vias 54 extend between the layers 48 and 50 to form a magnetic circuit which provides lateral as well as vertical magnetic shielding. Further illustrated is another LTCC sheet 58 which is sandwiched above the sheet 46.

Figure 7:
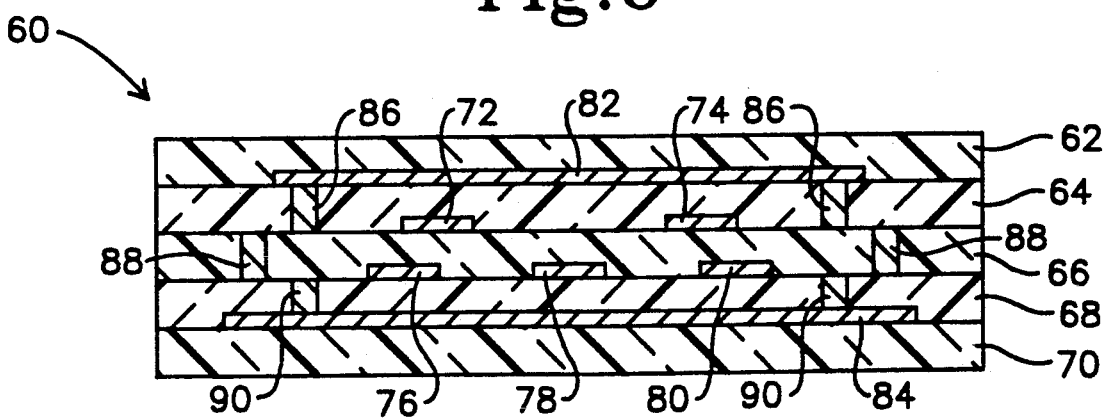
FIG. 7 is a sectional view illustrating an LTCC tape structure including an alternative magnetic shield layer and via arrangement.

FIG. 7 illustrates another magnetic shielding arrangement according to the present invention. An LTCC structure 60 includes LTCC layers 62, 64, 66, 68 and 70. Electrical conductor traces or metallizations 72 and 74 are formed on the surface of the layer 66, whereas metallizations 76, 78 and 80 are formed on the surface of the layer 68. Vertical magnetic shielding is provided by ferromagnetic layers 82 and 84 formed on the surfaces of the layers 64 and 70 respectively. Lateral magnetic shielding is provided by ferromagnetic vias 86, 88 and 90 formed through the layers 64, 66 and 68 respectively.

The vias 88 are staggered from the vias 86 and 90 to prevent excessive local material thickness and weakness. Although the vias described and illustrated thus far have circular cross-sections, it is within the scope of the invention to form ferromagnetic vias with linear, arcuate or other cross-sections.

Figure 9:
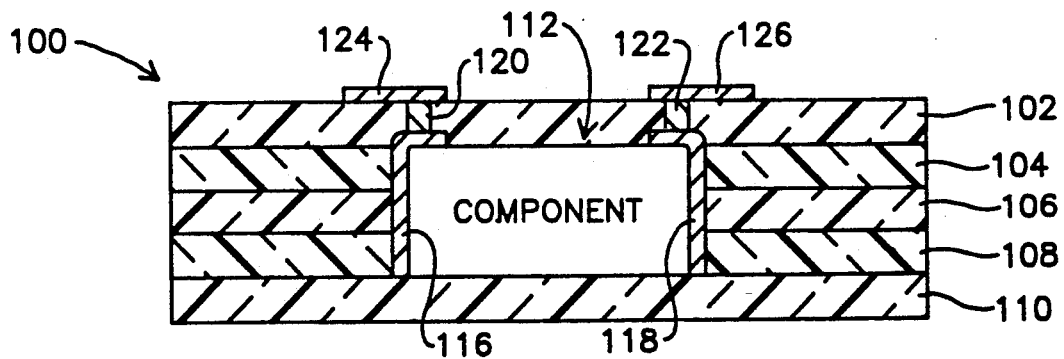
FIG. 9 is a section taken on a line IX—IX of FIG. 8 after cofiring of the structure.

FIGS. 8 and 9 illustrate another LTCC structure 100 embodying the present invention prior to lamination and after cofiring respectively. The structure 100 includes LTCC sheets 102, 104, 106, 108 and 110. Vertically aligned holes 104a, 106a and 108a are formed through the sheets 104, 106 and 108 respectively to form a cavity 112 as illustrated in FIG. 9. A drop-in component 114, which can be an inductor, thermistor, capacitor, varistor, ferromagnetic core or other element has a shape corresponding to the cavity 112 and is inserted therein during assembly.

The component 114 is made of a material or materials which are cofirable with LTCC tape. The component 114 can be fired prior to assembly in the structure 100, or can be cofired (for sintering) with the LTCC tape sheets. Further illustrated are conductor layers 116 and 118 which extend from the opposite lateral ends of the conductor 114 over the upper edge thereof, and vias 120 and 122 which extend through the sheet 102 for connection to conductor pads 124 and 126 respectively.

Figure 10:
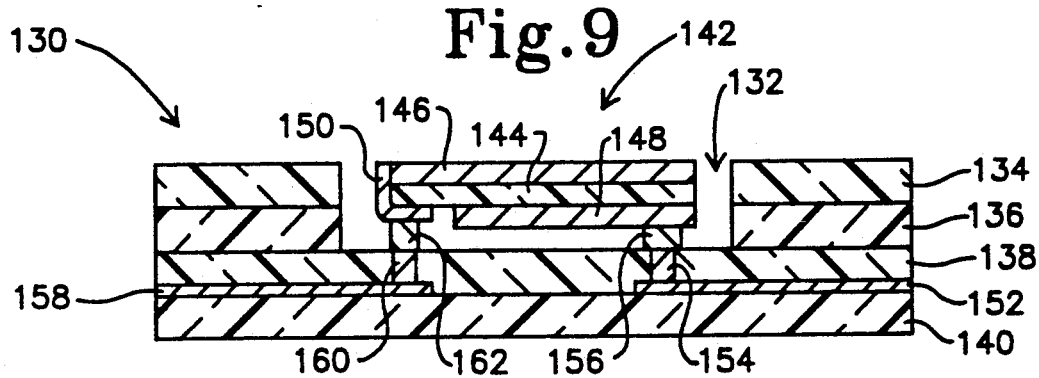
FIG. 10 is a sectional view of an LTCC structure including a drop-in component disposed in a cavity which extends from the surface partially into the structure.

Whereas the cavity 112 of the structure 100 is buried between the sheets 102 and 110, FIG. 10 illustrates another LTCC structure 130 in which a drop-in component is mounted in a cavity 132 formed through only the upper layers of the structure 130. More specifically, the structure 130 includes LTCC sheets 134, 136, 138 and 140. The cavity 132 extends through only the sheets 134 and 136.

In this case, the drop-in component is a capacitor 142 including a dielectric layer 144 which is sandwiched between conductor layers 146 and 148. A conductor layer 150 extends from the layer 146 downwardly around the left end and wraps around a portion of the lower surface of the dielectric layer 144. The conductor 148 is omitted in this area to prevent shorting of the layer 150 to the layer 148. The conductor layer 148 is connected to a buried metallization 152 formed on the sheet 140 by a via 154 which extends through the sheet 138 and a solder connection 156. The conductor layer 150 is connected to a buried metallization 158 formed on the sheet 140 by a via 160 which extends through the sheet 138 and a solder connection 162.

Figure 11:
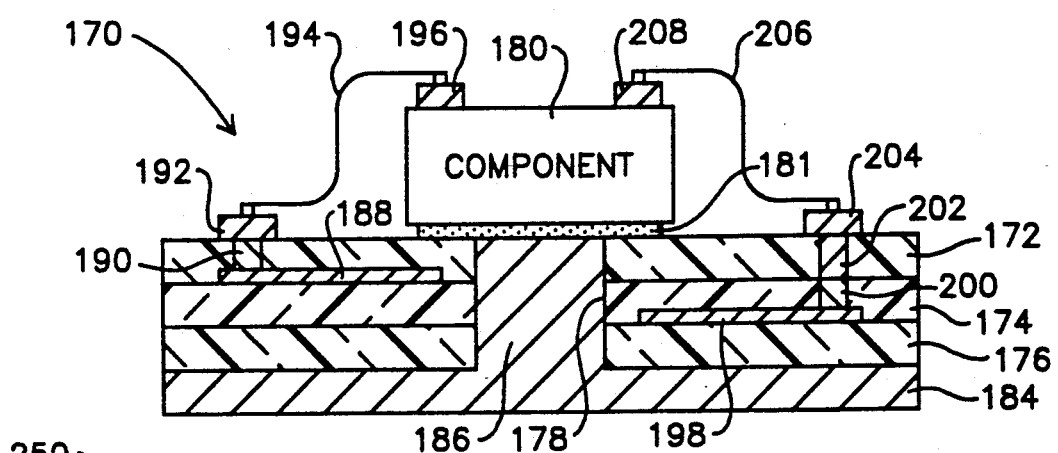
FIG. 11 is a sectional view of an LTCC structure including a drop-in component in the form of a heat sink.

As illustrated in FIG. 11, it is within the scope of the invention to incorporate a drop-in component made of a non-magnetic material into an LTCC structure 170 which includes LTCC tape sheets 172, 174 and 176. A cavity 178 extends through all of the sheets 172, 174 and 176. A component, such as a microelectronic integrated circuit chip 180, is mounted on the structure 170 above the cavity 178 by a thermally conductive adhesive 181.

An integral heat sink 182, made of aluminum or other thermally conductive material, includes a planar base portion 184, and a vertical portion 186 which extends upwardly from the base portion 184 through the cavity 178 into thermal contact with the component 180. Heat generated by the component 180 is conducted to the base portion 184 of the heat sink 182 through the vertical portion 186 thereof and dissipated into the atmosphere.

The structure 170 is fabricated by assembling the LTCC sheets 172, 174 and 176 onto the heat sink 182, laminating, prefiring and cofiring. Although not specifically illustrated, it is further within the scope to fully or partially bury the component 180 in the sheets 172, 174 and 178.

Further illustrated in FIG. 11 is a metallization 188 which is formed on the sheet 174 and connected to the component 180 by a via 190, bonding pad 192, wire bond 194 and bonding pad 196. A metallization 198 is formed on the sheet 176 and connected to the component 180 by vias 200 and 202, a bonding pad 204, wire bond 206 and bonding pad 208.

Figures 13, 14:
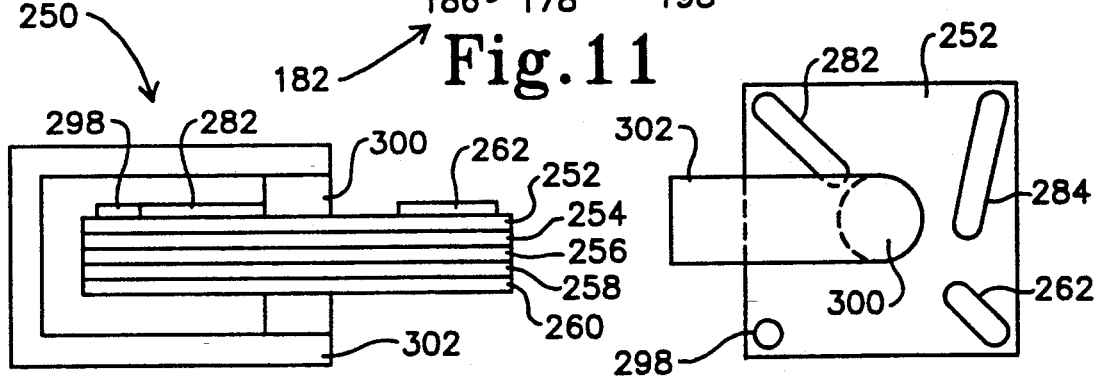
FIG. 13 is a side elevation of the transformer structure of FIG. 12 after cofiring and core assembly.
FIG. 14 is a plan view of the transformer structure of FIG. 12.
Figure 12:
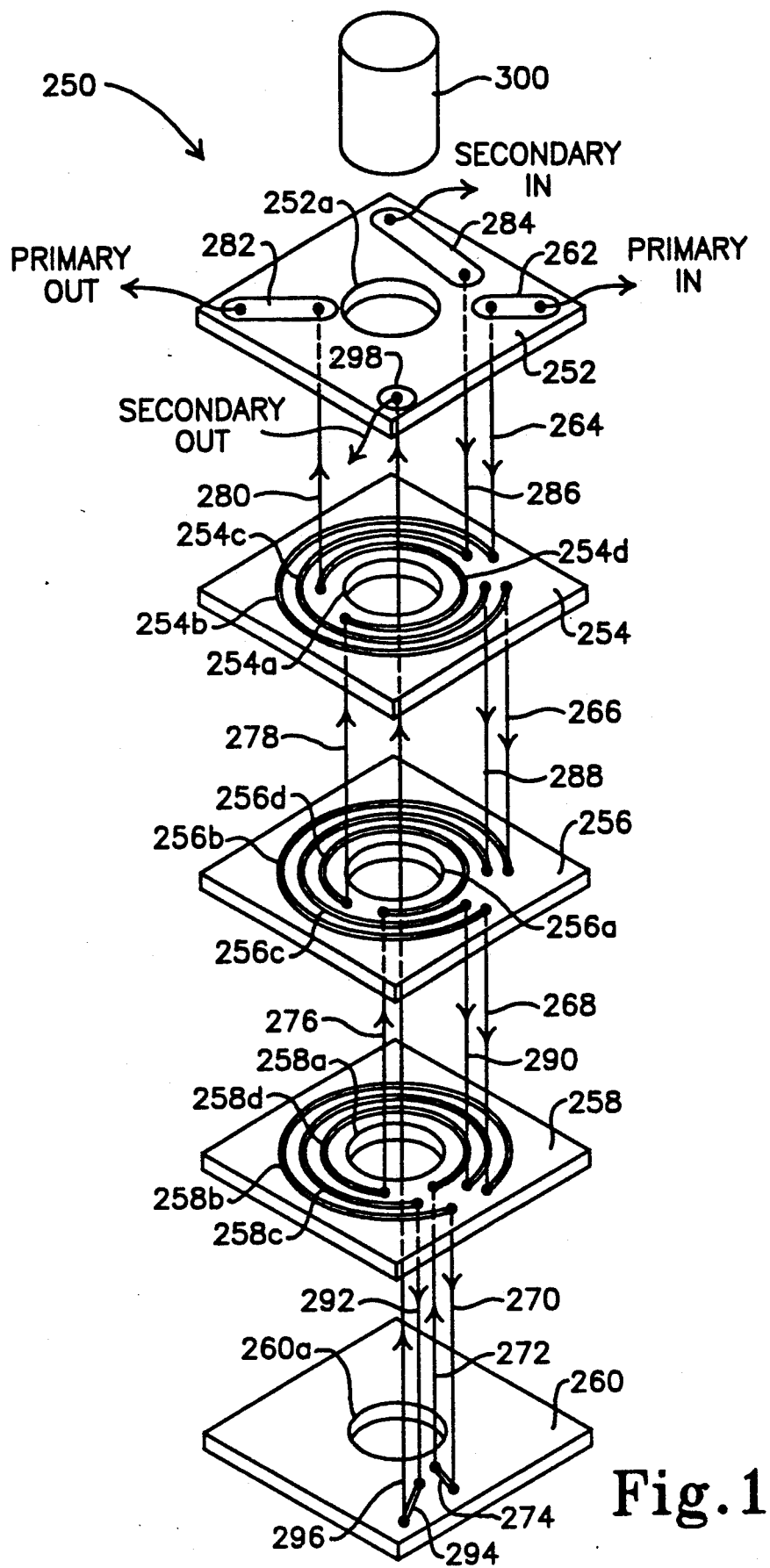
FIG. 12 is an exploded view illustrating an LTCC tape transformer structure prior to lamination.

FIGS. 12 to 14 illustrate an LTCC transformer structure 250 embodying the present invention, including LTCC tape sheets 252, 254, 256, 258 and 260 which are formed with central circular holes 252a, 254a, 256a, 258a and 260a respectively. Three electrical conductors in the shape of concentric circular arcs are formed on each of the sheets 254, 256 and 258. More specifically, radially outer conductors 254b, 256b and 258b, radially central conductors 254c, 256c and 258c and radially inner conductors 254d, 256d and 258d are formed on the sheets 254, 256 and 258 respectively.

Each of the conductors has a gap as illustrated. The ends of the conductors on adjacent sheets are interconnected by vias which are not illustrated explicitly, but indicated by arrows. The outer conductors 254b, 256b and 258b are interconnected by vias to constitute a first section of a primary winding through which current flows downwardly. The inner conductors 254d, 256d and 258d are interconnected by vias to constitute a second section of the primary winding through which current flows upwardly.

The first and second sections of the primary winding are interconnected to form a continuous electrical current path which generates additive magnetic fields. The central conductors 254c, 256c and 258c are interconnected to constitute a secondary winding through which current flows downwardly. Current flows counterclockwise through all of the conductors.

The operation of the transformer structure 150 will become clear from a description of current flow through the conductors and vias. Current enters the primary winding through a conductor pad 262 formed on the sheet 252, flows downwardly through a via 264, through the conductor 254b, downwardly through a via 266, through the conductor 256b, downwardly through a via 268, through the conductor 258b and downwardly through a via 270.

The via 270 is connected to a via 272 by a metallization 274 formed on the sheet 260. Current flows upwardly through the via 272, through the conductor 258d, upwardly through a via 276, through the conductor 256d, upwardly through a via 278, through the conductor 254d and upwardly through a via 280 to a bonding pad 282.

The magnetic field induced in the secondary winding from the primary winding flows into a bonding pad 284 and downwardly through a via 286, through the conductor 254c, downwardly through a via 288, through the conductor 256c, downwardly through a via 290, through the conductor 258c and downwardly through a via 292 to a metallization 294 formed on the sheet 260. Current flows upwardly from the metallization 294 through a via 296 and out through a bonding pad 298.

The transformer structure 250 provides a voltage step-down ratio of 1:2, since the primary winding has twice as many turns as the secondary winding. It is of course possible to operate the transformer structure 250 in reverse, in which case the primary winding would include the central conductors and the secondary winding would include the inner and outer conductors. In this case, the primary winding would have half as many turns as the second winding, and the structure 250 would provide a voltage step-up ratio of 2:1. It is further within the scope of the invention, although not specifically illustrated, to provide two or more primary windings and/or two or more secondary windings.

The transformer structure 250 further comprises a central core 300 formed of a ferromagnetic material which extends through the holes 252a, 254a, 256a, 258a and 260a. Preferably, the core 300 is assembled and cofired with the sheets 252, 254, 256, 258 and 260 as described above. As illustrated in FIGS. 13 and 14, the structure 250 may further include a C-core 302 which engages with the ends of the central core 300 and forms a complete magnetic circuit therewith.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A cofired ceramic tape circuit structure, comprising;
    a plurality of sandwiched sheets of low-temperature-cofired-ceramic (LTCC) tape; and
    a ferromagnetic element sandwiched between sheets of said tape, said element being formed of a material which is substantially chemically non-reactive with, is sinterable using a same firing profile as and has approximately the same thermal shrinkage characteristics as said tape,
    wherein said the ferromagnetic material comprises a ferromagnetic oxide, a glass powder (or frit) and an organic binder.

2. A structure as in claim 1, in which said material comprises a glass frit having a melting point of approximately 500–650° C.

3. A structure as in claim 1, in which said material comprises;
    a ferromagnetic oxide powder; and a glass frit including silicon dioxide ($SiO_2$) and at least one material selected from the group consisting of lead oxide (PbO), bismuth oxide ($Bi_2O_3$), sodium oxide ($Na_2O$), lithium oxide ($Li_2O$), and potassium oxide ($K_2O$).

4. A structure as in claim 1, in which said element comprises a vertical interconnect (via) which extends through at least one of said sheets.

5. A structure as in claim 1, in which said element is flat.

6. A structure as in claim 1, in which:
the structure further comprises an inductor formed between sheets of said tape; and
said element is arranged to increase the inductance of the inductor.

7. A structure as in claim 6, in which:
the inductor includes a flat electrical conductor having a predetermined shape; and
said element comprises a flat layer which is vertically aligned with said conductor.

8. A structure as in claim 1, in which:
the structure further comprises an electrical component disposed between sheets of said tape; and
said element comprises a flat layer which is vertically aligned with and magnetically shields said component.

9. A ferromagnetic material which is cofirable with and chemically non-reactive with low-temperature-cofired-ceramic (LTCC) tape, comprising:
a ferromagnetic oxide;
an organic vehicle; and
a glass frit comprising constituents selected such that said material is sinterable using a same firing profile as and has approximately the same thermal shrinkage characteristics as said tape.

10. A material as in claim 9, in which the glass frit has a melting point of approximately 500–650° C.

11. A material as in claim 10, in which the glass frit comprises silicon dioxide ($SiO_2$) and at least one material selected from the group consisting of lead oxide (PbO), bismuth oxide ($Bi_2O_3$), sodium oxide ($Na_2O$) lithium oxide ($Li_2O$) and potassium oxide ($K_2O$).

12. A material as in claim 9, further comprising a solvent in a proportion selected such that said material is in fluid form and has a ink viscosity.

13. A material as in claim 9, in which said vehicle is selected such that said material is in solid form and has tape flexibility.

14. A material as in claim 13, in which said material is formed as a tape sheet.

15. A material as in claim 9, in which the ferromagnetic oxide comprises nickel-zinc ferrite ($NiZnFe_3O_4$).

16. A material as in claim 9, in which the ferromagnetic oxide is selected from the group consisting of spinels, including magnetoplumbites and garnets.

* * * * *

UNITED STATES PATENT AND TRADEMARK OFFICE
CERTIFICATE OF CORRECTION

PATENT NO. : 5,312,674

DATED : May 17, 1994

INVENTOR(S) : CAROL HAERTLING, ANDREW A. SHAPIRO, CHARLES A. GOODMAN, ROBERT D. WASHBURN and ROBERT F. McCLANAHAN It is certified that error appears in the above-identified patent and that said Letters Patent is hereby corrected as shown below:

On title page, item [75] Inventors, delete

"Ramona G. Pond, Downey, CA;"

"Carlos H. Gonzales, La Mirada, CA;" and

"David M. Lusher, Gardena, CA."

Signed and Sealed this

Twenty-fifth Day of April, 1995

Attest:

BRUCE LEHMAN

*Attesting Officer*    *Commissioner of Patents and Trademarks*